United States Patent
Pinnow et al.

(10) Patent No.: US 7,749,805 B2
(45) Date of Patent: Jul. 6, 2010

(54) METHOD FOR MANUFACTURING AN INTEGRATED CIRCUIT INCLUDING AN ELECTROLYTE MATERIAL LAYER

(75) Inventors: Cay-Uwe Pinnow, München (DE); Klaus-Dieter Ufert, Unterschleißheim (DE)

(73) Assignee: Qimonda AG, Munich (DE)

( * ) Notice: Subject to any disclaimer, the term of this patent is extended or adjusted under 35 U.S.C. 154(b) by 1229 days.

(21) Appl. No.: 11/076,027

(22) Filed: Mar. 10, 2005

(65) Prior Publication Data
US 2006/0205110 A1  Sep. 14, 2006

(51) Int. Cl.
*H01L 21/06* (2006.01)
(52) U.S. Cl. .................. 438/102; 438/95; 438/239; 438/603
(58) Field of Classification Search ................. 438/102, 438/785, 786, 603, 604, 95, 239
See application file for complete search history.

(56) References Cited

U.S. PATENT DOCUMENTS

| | | | |
|---|---|---|---|
| 6,881,647 B2 * | 4/2005 | Stanbery | 438/455 |
| 2003/0146427 A1 | 8/2003 | Campbell | |
| 2004/0115938 A1 | 6/2004 | Scheer et al. | |
| 2004/0124406 A1 * | 7/2004 | Campbell et al. | 257/4 |
| 2004/0157416 A1 * | 8/2004 | Moore et al. | 438/501 |
| 2006/0239882 A1 * | 10/2006 | Seo et al. | 423/263 |

OTHER PUBLICATIONS

Griffiths, J.E. et al. (1983). "Raman Spectra and Athermal Laser Annealing of Ge($S_xSe_{1-x}$)$_2$ Glasses," *Physical Review B* 28(8):4444-4453.

Alberts, V. (2004). "Band Gap Engineering in Polycrystalline Cu(In,Ga)(Se,S)$_2$ Chalcopyrite Thin Films," *Materials Science & Engineering B* 107:139-147.

* cited by examiner

*Primary Examiner*—Kevin M Picardat
(74) *Attorney, Agent, or Firm*—Dicke, Billig & Czaja, PLLC

(57) ABSTRACT

A method for manufacturing an electrolyte material layer with a chalcogenide material incorporated or deposited therein for use in semiconductor memory devices, in particular resistively-switching memory devices or components. The method comprises the steps of producing a semiconductor substrate, depositing a binary chalcogenide layer onto the semiconductor substrate, depositing a sulphur-containing layer onto the binary chalcogenide layer, and creating a ternary chalcogenide layer comprising at least two different chalcogenide compounds $ASe_xS_y$. One component A of the chalcogenide compounds $ASe_xS_y$ comprises materials of the IV elements main group, e.g., Ge, Si, or of a transition metal, preferably of the group consisting of Zn, Cd, Hg, or a combination thereof.

26 Claims, 2 Drawing Sheets

METHOD FOR MANUFACTURING AN INTEGRATED CIRCUIT INCLUDING AN ELECTROLYTE MATERIAL LAYER

FIELD OF THE INVENTION

The invention refers to a method for manufacturing an electrolyte material layer comprising chalcogenide compound in semiconductor memory devices. In more detail, the invention refers to a method for manufacturing a chalcogenide compound for using as an electrolyte material layer in semiconductor memory devices or components, in particular resistively switching memories, and to memory devices manufactured by that method.

BACKGROUND OF THE INVENTION

In memory components, in particular semiconductor memory components, a distinction is made between so-called functional memory components, e.g., PLAs, PALs etc. and so-called tab memory components, e.g., ROM components (ROM=Read Only Memory), for example PROMs, EPROMs, EEPROMs, and Flash-memories, and RAM components (RAM=Random Access Memory), e.g., DRAMs or SRAMs (D=dynamic, S=static).

A RAM component is a memory device in which data is stored under a specific address, from which the data can be read later. In a high density RAM component it becomes important for the manufacturing of the individual cells to be kept as simple as possible.

With so-called SRAMs (SRAM=Static Random Access Memory) the individual memory cells for instance consist of a few transistors, and in so-called DRAMs (DRAM=Dynamic Random Access Memory) of only a single suitably controlled capacitance (e.g., the gate source capacitance of a MOSFET), with which in form of a charge one bit at a time can be stored. In the case of DRAMs, this charge only persists for a short period of time, which means that a so-called "refresh" process must be performed at frequent intervals (e.g., 64 ms).

In contrast, in the case of SRAMs, the charge does not need to be refreshed, i.e., the respective data stored in the cell as long as a supply voltage is fed to the SRAM non-volatile memories, such as ROM components (ROM=Read Only Memory) as well as PROMs, EPROMs, EEPROMs, and FLASH memories, are memory components in which the respective data remains stored even after the supply voltage is turned off.

In general, during the normal use of a ROM component, no write operations but only read operations are performed. Just as is the case for RAMs, the typical read access time, and the time it takes to write data onto the ROMs may differ between the different types of non-volatile memories.

The majority of non-volatile memories are based on charge storage and these devices are fabricated from materials available in CMOS processes (CMOS=complementary metal-oxide semiconductor). However, these memory concepts based on charge storage have some general drawbacks like high voltage operation (10-20V), slow programming speed (between μs and ms) and a limited programming endurance (typically $10^5$-$10^6$ write/erase cycles). Due to the required high voltages, high power consumption is needed for programming and erasing FLASH memories.

These shortcomings are caused by the requirement of long term data retention, which necessitates the existence of a large energy barrier that has to be overcome during programming and erasing the memory cell. The existence of such an energy barrier thus severely limits the performance and the scalability of these devices. These facts imply several severe restrictions regarding the system design. Thus, the major advantage of FLASH memory is its non-volatility and its small cell size, making FLASH memory well suited for high density memories combined with low manufacturing costs per bit.

In addition to the memory components mentioned above, so-called "resistive" or "resistively switching" memory devices have also become known recently, e.g., so-called Perovskite Memories, PMC Memories (PMC=Programmable Metallization Cell), Phase Change Memories, OUM memories (OUM=Ovonics or Ovonyx Unified Memories), hydrogenised, amorphous silicon memories (a-Si:H memories), polymer/organic memories, etc.

Perovskite memory cells are, for instance, known from S. Q. Liu et al., Appl. Phys. Lett. 76, 2749, 2000, and for example from W. W. Zhuang et al., IEDM 2002, etc. Polymer/organic memory cells (e.g., charge-transfer-complex-based polymer/organic memory cells) are for example described in X. Wan et al., Phys. Stat. Sol. A 181, R13, 2000.

In a PMC memory, during the programming of the cell, a metallic dendrite between respective electrodes—depending on whether a logic "1", or a logic "0" shall be written into the cell—is either built up, or dissolved. Thus, the contents of the PMC memory is defined by the respective resistance between the electrodes.

The resistance between the electrodes is controlled by suitable current or voltage pulses applied to electrodes arranged at the PMC memory, thereby causing suitable electrochemical reactions which lead to the building up or dissolution of the above-mentioned metallic connection between the electrodes. Such programmable metallization cells (PMC) comprise an electrolyte material layer of so-called chalcogenide material enriched with, e.g., Ag or Cu which is capable of electrochemical reactions due to externally applied voltage or current pulses, thereby changing the electrical resistance of the electrolyte chalcogenide material layer and the entire PMC memory.

PMC memory is, e.g., disclosed in: Y. Hirose, H. Hirose, J. Appl. Phys. 47, 2767 (1975), M. N. Kozicki, M. Yun, L. Hilt; A. Singh, Electrochemical Society Proc., Vol. 99-13, (1999) 298; in M. N. Kozicki, M. Yun, S. J. Yang, J. P. Aberouette, J. P. Bird, Superlattices and Microstructures, Vol. 27, No. 5/6 (2000) 485-488; M. N. Kozicki, M. Mitkova, J. Zhu, M. Park, C. Gopalan, "Can Solid State Electrochemistry Eliminate the Memory Scaling Quandry", Proc. VLSI (2002); and R. Neale, "Micron to look again at non-volatile amorphous memory", Electronic Engineering Design (2002). The contents of these documents is incorporated herein by reference.

For future mobile applications, low power consumption, non-volatility and high operation speed enabling fast data rates, are mandatory. Since charge storage memories (e.g., DRAM and floating gate memories like FLASH) are reaching their scaling limits due to data retention problems caused by inevitable charge leakage from the cells, and moreover, poor data sensing capability of the ever-decreasing amounts of stored charge, alternative electronic switching mechanisms seem superior to meet the above-mentioned requirements.

In the case of "resistive" or "resistively switching" memory devices, an electrolyte material layer comprising a chalcogenide compound is positioned between two suitable electrodes, e.g., an anode and a cathode. By appropriate switching processes, said electrolyte chalcogenide material layer can be put in a more or less conductive state. Thereby, e.g., the more conductive state may correspond to a stored logic "1" and the less conductive state may correspond to a stored logic "0", or vice versa.

In principle, the electrolyte chalcogenide material layer of a resistively-switching memory cell comprises a host matrix material and metallic material incorporated or deposited therein. The memory switching mechanism of a resistively-switching memory cell is substantially based on a variation of the concentration of metallic material incorporated in the host matrix material, which can be a chalcogenide glass for example. The resistivity of the host matrix material can vary over orders of magnitudes from a high resistivity (i.e., exhibiting an insulating or semiconducting behaviour) to low resistivity values, which are lower by several orders of magnitude. This huge resistance change is caused by local variations of the chemical composition on a nanoscale structure.

In addition to the formation of a dendritic pathway in the above mentioned PMC memory cells, the resistive switching mechanism can also be caused by the statistical bridging of multiple metal rich precipitates. Upon continued application of a write pulse to the resistively-switching cell, the precipitates grow in density until they eventually touch each other, forming a conductive bridge through the entire memory cell, which results in a highly conductive, metallic or semiconducting connection between the two electrodes of the memory cell. This corresponds to a percolation mechanism including the formation of precipitates, which are present in the electrolyte chalcogenide material layer, leading to an electrical bridging of the electrodes by a highly conductive connection. However, the precipitates can be sustained for long storing times, so that the non-volatility of the state can be guaranteed.

In addition to the existence of these precipitates, there are also metallic, semiconducting, or ionic constituents present in the electrolyte chalcogenide material layer, which are free to move therein. This movement can be stimulated, for example, by applying external electric fields to the matrix, so that an electrically induced ion drift occurs. Electrically induced movement offers the advantage that reversible concentration changes can be obtained simply by driving in and pulling out these mobile metal ions. An increased or decrease in the size of the precipitates can occur as a result of the mobility of these metallic or ionic components.

For this reason, the electrolyte chalcogenide matrix material is in direct contact with the first electrode. The second electrode, which is also in contact with the electrolyte chalcogenide material, contains the above mentioned metallic, semiconducting, or ionic constituents and exhibits the required solubility and the required high mobility within the electrolyte chalcogenide material. The first and second electrodes have neither a direct electrical contact nor an interface with each other, so that the electrolyte chalcogenide material layer separates the two electrodes. However, the electrodes can be in direct contact with other conducting or doped semiconducting materials (e.g., metal wires or metal plugs) to electrically connect the memory cell to other devices, such as transistors or other memory cells.

In the case of resistive or resistively-switching memory devices (Perovskite memories, Phase Change Memories, PMC memories, a-Si:H memories, polymer/organic memories, etc.), it is desirable to keep the layer thickness of the material positioned between the electrodes—which is correspondingly to be switched to a state of high or low conductivity—as small as possible. This makes it possible to increase the field strengths achieved in the respective material, which may result in a correspondingly high switching rate.

Various processes for depositing GeSe and GeS layers have been proposed in the state of the art. However, known GeSe layers exhibit the inherent drawback that they cannot be integrated in CMOS technology processes (CMOS= complementary metal-oxide semiconductor) and are thus not suitable for volume production because the thermal stability of the selenium-containing chalcogenide layers is not sufficient to survive the back end of line (BEOL) process temperatures (typically 400-450° C.). This is because in binary, selenium-containing materials or selenium-containing compounds the glass transition temperature and the crystallization temperature are too low. Consequently, a segregation or a crystallization, respectively, occurs in the layers, which limits or even completely destroys the functionality of the selenium-containing chalcogenide layers as a solid-state electrolyte material. In the case of binary, sulfidic compounds the intrinsic ion mobility of metal ions (e.g., silver) is too low to produce a memory cell that switches at a sufficient rate.

SUMMARY OF THE INVENTION

Therefore, the present invention provides a non-volatile memory cell on the basis of CMOS technology with a fast, scalable, low-voltage switching mechanism and a high switching endurance. In particular, the present invention provides a novel method for manufacturing a resistively switching memory system that can be manufactured on the basis of CMOS technology.

In accordance with the invention, a method is provided for manufacturing an electrolyte material layer with a chalcogenide material incorporated or deposited therein for using in semiconductor memory devices, in particular resistively-switching memory devices or components. The method comprises the following steps:

producing a semiconductor substrate, depositing a binary chalcogenide layer onto the semiconductor substrate, depositing a sulfur containing layer onto the binary chalcogenide layer, and creating a ternary chalcogenide layer comprising at least two different chalcogenide compounds $ASe_xS_y$, wherein one component A of the chalcogenide compounds $ASe_xS_y$ comprises materials of the IV elements main group, e.g. Ge, Si.

The present invention provides a method of producing thin, ternary chalcogenide layers that can be employed as solid state electrolyte materials in semiconductor memory elements. In accordance with the present invention, CMOS based memory components and the electrolyte material layer with a chalcogenide compound for resistively switching memory components can be manufactured via CMOS processes only—instead of using two or more different technologies. Thereby, the complexity of manufacturing processes, and thus the costs of the entire memory system, can be reduced.

A resistively switching memory cell with an electrolyte chalcogenide material layer manufactured according to the present invention provides a favourable scalability to extremely small feature sizes, thus enabling higher bit density. The novel memory concept is capable of operating at low programming voltages and can reach fast switching times, thus offering a broad range of various applications.

Further advantages of the method of producing thin, ternary chalcogenide layers according to the present invention reside in the following aspects:

Combination of the positive characteristics of GeSe as a fast ion conductor and GeS with high thermal stability is possible.

Gradual optimization of the stoichiometry and thus of the solid state electrolyte characteristics is possible by continuously adding a respective sulfur amount.

Filling of contact holes with nanoscale dimensions is possible by the use of a chemical vapor deposition method.

Low temperature process and process compatibility with common integration schemes.

Simple process control.

The production of binary chalcogenide layers may, for instance, be performed by means of the following methods:

Sputtering of a binary sputter target (e.g., GeSe), or reactive sputtering of the component A (e.g., A=Ge, Si) in a selenium- or sulfur-containing atmosphere, e.g., in Argon, $H_2S$ or $H_2Se$ atmosphere. The production of a binary selenium-containing or sulfidic A-Se or A-S layer (e.g., A=Ge, Si) may be, for instance, performed by a layer depositing process such as (thermal) chemical vapor deposition (CVD), plasma-enhanced chemical vapor deposition (PECVD), atomic layer deposition (ALD), physical vapor deposition (PVD), or evaporation.

According to a principle idea of the present invention, the electrolyte layer of the memory cell comprising a compound $A_xSe_{1-x-y}S_y$ is formed, wherein A preferably comprises materials of the IV elements main group, e.g., A=Ge, Si, etc., to create a so-called ternary layer. These ternary layers with two chalcogenide components have the advantage that important parameters for the functionality of the memory cell can be set independently of one another by means of the processes according to the present invention, while the exact stoichiometry (doping) and the morphology can, in addition, be optimized in a further thermal process step (e.g., furnace process, RTP process, and the like). Above all, the stoichiometry and thus the thermal characteristics of the ternary layers, such as glass transition temperature, crystallization temperature, as well as further parameters such as layer strength, microstructure, etc. can be set independently of one another.

In other words, the present invention produces a ternary chalcogenide layer with at least two chalcogenide components by a combined deposition and diffusion method. To this end, a further chalcogenide layer (e.g., sulfur) is deposited onto a binary selenium-containing chalcogenide layer by means of the process described in more detail hereinafter. This sulfur layer reacts in-situ on the substrate, so that a ternary compound (e.g., a compound of Ge—Se—S or Si—Se—S) is formed as a coherent layer on the substrate.

Moreover, subsequent annealing in an inert or chalcogenide-containing atmosphere can be employed for optimizing the stoichiometry, the morphology, the defect density, the doping, and/or the microstructure of the ternary layer.

In an embodiment of the method according to the present invention, an A-Se layer comprising a compound with A=Ge, Si, etc. is transformed into a ternary A-Se—S layer, by depositing a sulfur layer by means of the metal-organic chemical vapor deposition (MOCVD) method, making use of carbonyl sulfide (chemical formula COS or S=C=O, when expressed with correct bonding relations) as a gaseous reaction component containing the sulfur. This sulfur layer will react with the existing A-Se layer on the substrate to form a ternary A-Se—S layer.

According to another embodiment of present invention, a substrate temperature in the range of about 150° C. to 250° C. is chosen for the process. The COS gas may be introduced via a gas shower opening into the reactor of a CVD system. The gas flow is preferably controlled and monitored by means of gas flow control meters. The supply lines to the CVD system may be heated optionally. A pressure of about 500 mTorr is proposed as the preferred process pressure in the CVD reactor, whereas a substantially broader operating range of, e.g., 10 mTorr to 10 Torr is also possible. Furthermore, inert carrier gases (e.g., $N_2$, Ar, etc.) may be added to the COS gas.

During the reaction on the surface, the COS molecules split up into carbon monoxide (CO) and sulfur (S). The sulfur reacts on the surface of the substrate with the existing layer (here, a selenium layer); the carbon monoxide molecule is inert and is evacuated from the gas space by a vacuum pump, so that it is not incorporated significantly into the layer. This section of the method according to an embodiment of the present invention may be represented chemically in a multi-stage process as follows.

I. Thermal Dissociation on the Substrate Surface:

$$COS \xrightarrow{150° C. \ldots 250° C.} CO + S$$

wherein the process step is performed under a process temperature in the range of about 150° to 250° C. In this stage of the process the carbon monoxide (CO) is removed from the gas space by the vacuum pump. The temperature range might also be extended to a range of about 100° to 350° C., to optimize the reaction rate at the substrate surface.

II. Adsorption and Reaction of the S Atoms on the Chalcogenide Surface:

$$S + ASe \rightarrow ASe_xS_y$$

wherein A=Ge, Si, etc. or other materials of the IV elements main group, or transition metals (especially Zn, Cd, Hg).

By this method, the sulfur doping of the ternary layer may be set by varying the duration of deposition and the substrate temperature.

BRIEF DESCRIPTION OF THE DRAWINGS

Details of the present invention will be more fully understood when considered with respect to the following description, appended claims and accompanied drawings, wherein:

DETAILED DESCRIPTION OF THE INVENTION

Figure 1:
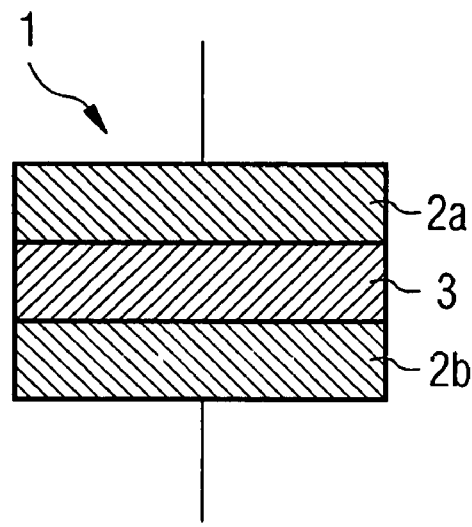
FIG. 1 shows a schematic representation of a cross-section through a resistively switching memory cell according to prior art.

FIG. 1 is a schematic representation of a section through a resistively switching memory cell according to prior art. It comprises two corresponding metal electrodes 2a, 2b (i.e., one anode and one cathode), between which a corresponding, electrochemical "electrolyte" material layer 3 comprising a chalcogenide compound is positioned which is adapted to be set, by appropriate switching processes, in a more or less conductive state.

For programming the resistively switching memory cell 1 (depending on whether a logic "One" or a logic "Zero" is to be written into the memory cell 1), appropriate current pulses are applied to the electrodes 2a, 2b and electrochemical reactions in the electrolyte chalcogenide material layer 3 are caused by the pulses, which result in a conductive state or a non-conductive state of the cell 1. Due to the resistive switching mechanism, a metallic connection/clusters between electrodes 2a, 2b is either built up, or dissolved depending on whether a logic "1", or a logic "0" shall be written into the cell 1. To this end, the low-resistance state may correspond to a stored logic "One", and the high-resistance state may correspond to a stored logic "Zero", or vice versa. If, for instance, a PMC memory cell is used as memory cell 1, a chalcogenide layer (e.g., a GeSe or GeS layer) saturated with an appropriate metal (e.g., Ag or Cu) may be used as electrolyte material layer 3, or other suitable ionic conductor materials, such as $WO_x$, may be used.

The resistance between the electrodes 2a, 2b is controlled by suitable programming pulses (write pulses or negative pulses) on respective control lines connected with the resistively switching memory cell 1 via the electrodes 2a, 2b, thereby causing the described electrochemical reactions which lead to the building up, or dissolution of the above-mentioned metallic clusters between the electrodes 2a, 2b, as described in the present specification. The contents of the respective memory cell 1 is defined by the respective resistance between the electrodes 2a, 2b, which can be measured via respective connection lines applying a voltage between the electrodes 2a, 2b, i.e., measuring whether or not a current or a current above a predetermined value flows.

By means of a plurality of memory cells of a structure similar to that of the memory cell 1 illustrated in FIG. 1 that are, for example, positioned array-like side by side, a memory device or component with an appropriate memory capacitance can be provided. By applying a corresponding signal (e.g., a read/write signal) to a write/read selection pin or pad of the memory component, respectively, which is not illustrated here, it can be selected whether data is to be stored in, or to be read from the memory component under a certain address.

The data input into the memory component is stored in corresponding memory cells 1 as defined by the above address, and can later on be read again from the corresponding memory cells 1. Furthermore, memory components comprising arrays of resistively-switching memory cells 1 can be connected to one or more devices, e.g., one or more processors, or other semiconductor devices, which—under control of a controller—make use of the memory component to store data therein, and to read the stored data.

Figure 2:
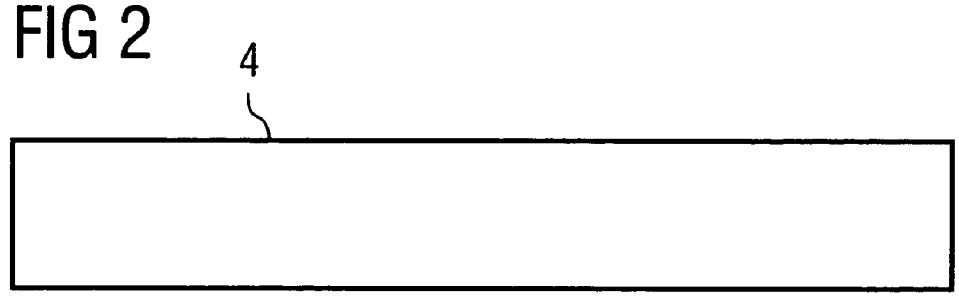
FIG. 2 shows a schematic representation of a structure in a first step of the method for manufacturing a chalcogenide compound layer in a resistively switching memory cell according to an embodiment of the present invention.

Referring to FIG. 2, a schematic of a structure is shown in a first step of the method for manufacturing a chalcogenide compound layer for use in a resistively-switching memory cell according to an embodiment of the present invention. The process according to the present invention may start from a substrate 4 which is made of a semiconducting material, e.g., Silicon (Si). The semiconducting Silicon substrate 4 preferably already comprises the necessary (structured) layers.

Figure 3:
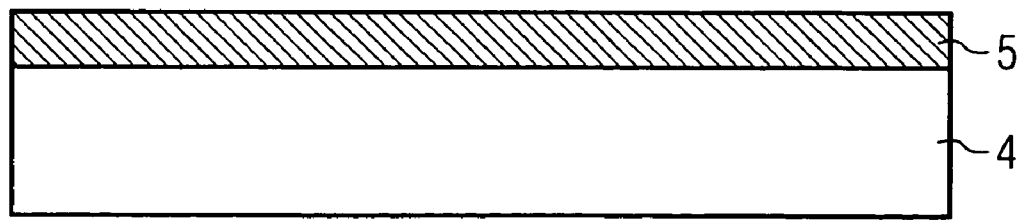
FIG. 3 shows a schematic representation of a structure in a second step of the method for manufacturing a chalcogenide compound layer in a resistively switching memory cell according to an embodiment of the present invention.

FIG. 3 shows the semiconducting structure in a second step of the method for manufacturing a chalcogenide compound layer. In this second step of the process, a binary chalcogenide layer 5 is produced on the surface of the semiconducting substrate 4. To this end, a binary selenium-containing A-Se layer 5 (with A=Ge, Si, or other materials of the IV elements main group or a transition metal, especially Zn, Cd, Hg) is created by a suitable layer deposition process such as (thermal) chemical vapor deposition (CVD), plasma-enhanced chemical vapor deposition (PECVD), atomic layer deposition (ALD), physical vapor deposition (PVD), or evaporation. The binary chalcogenide layer 5 may be produced by sputtering of a binary sputter target (e.g., GeSe), or reactive sputtering of the component A in a selenium-containing atmosphere, e.g., in $H_2Se$ atmosphere.

Figure 4:
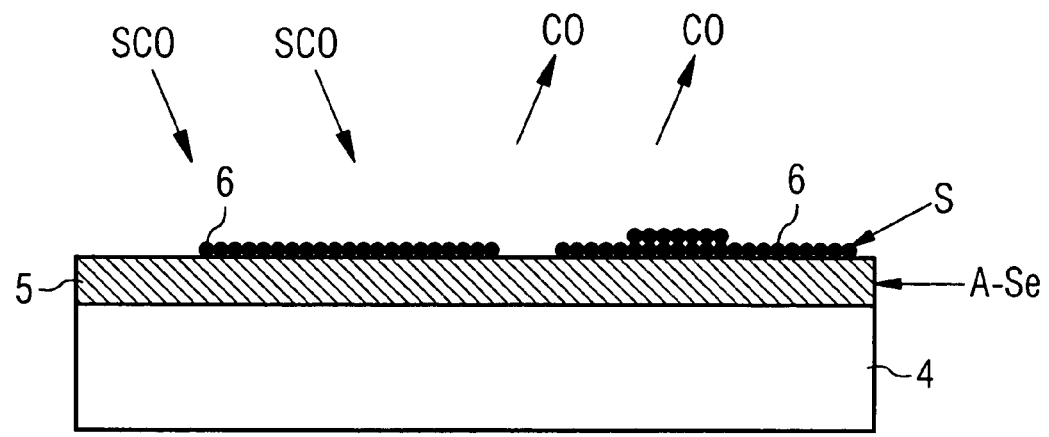
FIG. 4 shows a schematic representation of a structure in a third step of the method for manufacturing a chalcogenide compound layer in a resistively switching memory cell according to an embodiment of the present invention.

FIG. 4 shows a schematic representation of a structure in a third step of the method for manufacturing a chalcogenide compound layer in an embodiment of the present invention. In this third step of the process, a sulfur-containing layer 6 is created on the binary selenium-containing A-Se layer 5 by a combined deposition and diffusion method. Therefore, a further chalcogenide layer 6 containing sulfur is deposited onto the binary selenium-containing chalcogenide layer 5.

For this process step, a substrate temperature in the range of about 100° C. to 350° C. is used. Carbonyl sulfide gas COS (with an evaporation temperature of about $T_{KP}=-50.2°$ C.) is introduced into the reactor chamber via a gas shower opening. The COS gas flow is controlled and monitored by a gas flow meter, and the supply lines to the CVD system may be heated optionally. A pressure of about 500 mTorr is used as the preferred process pressure in the CVD reactor. Furthermore, inert carrier gases (e.g., $N_2$, Ar, etc.) may be added to the COS gas.

In a preferred embodiment, this process step is performed by means of the MOCVD method, making use of carbonyl sulfide COS as a gaseous reaction component containing the sulfur S. As shown in FIG. 4, during the reaction on the surface the gaseous carbonyl sulfide COS split up into solid sulfur S and gaseous carbon monoxide CO. The sulfur S forms the sulfur layer 6, while the gaseous carbon monoxide CO is escaping from the layer 6 and evacuated from the reaction chamber by a vacuum pump of a vacuum system.

Figure 5:
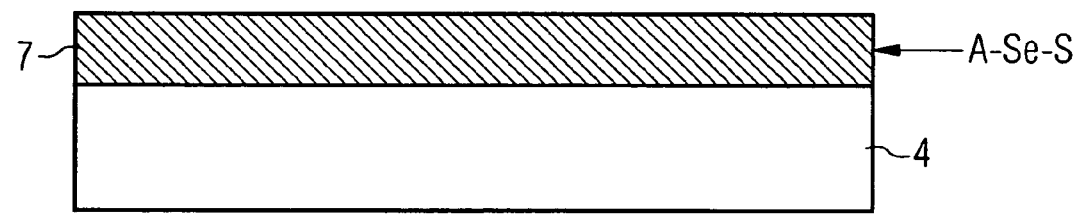
FIG. 5 shows a schematic representation of a structure in a fourth step of the method for manufacturing a chalcogenide compound layer in a resistively switching memory cell according to an embodiment of the present invention.

FIG. 5 shows a schematic representation of a structure in a fourth step of the method for manufacturing a chalcogenide compound layer. In this fourth step of the process, the sulfur layer 6 reacts in-situ with the existing binary A-Se layer 5. Thus, a ternary compound comprising two chalcogenide components (e.g., a compound of Ge—Se—S or Si—Se—S) is formed as a coherent ternary A-Se—S chalcogenide layer 7 on the substrate 4. The adsorption and reaction of the sulfur atoms S on the binary chalcogenide surface 5 can be expressed in the following chemical equation:

$$S + ASe \rightarrow ASe_xS_y, \text{ with } A=Ge, Si, Sn, Pb, Cd, Zn, Hg$$

This fourth step of the process can be performed in-situ, i.e., during the deposition of the sulfur-containing layer 6 on the binary selenium-containing A-Se layer 5 (third step of the process, FIG. 4) by means of the MOCVD method. Alternatively, the adsorption and reaction of the sulfur atoms S on the binary chalcogenide surface 5 may also be performed ex-situ, i.e., after termination of depositing the sulfur-containing layer 6 on the binary selenium-containing A-Se layer 5, or during the deposition of the sulfur-containing layer 6 and afterwards.

Figure 6:
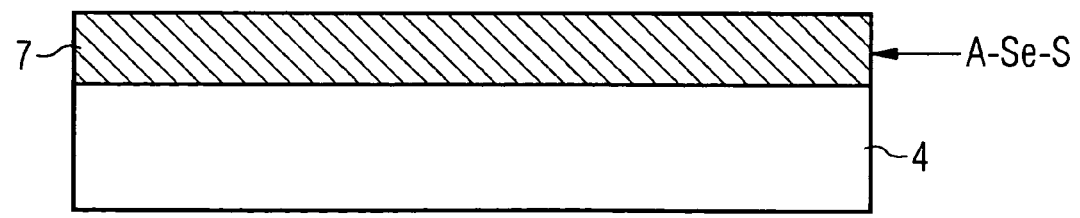
FIG. 6 shows a schematic representation of a structure in a fifth step of the method for manufacturing a chalcogenide compound layer in a resistively switching memory cell according to an embodiment of the present invention.

Subsequently, in a sixth step of the process according to an embodiment of the present invention, a thermal process step (e.g., furnace process, RTP process, and the like) is employed in a suitable atmosphere as shown in FIG. 6. By this subsequent annealing process step the exact stoichiometry (doping), the microstructure, and the morphology of the ternary chalcogenide layer 7 is optimized. By varying the duration of deposition and the substrate temperature during the annealing process, the sulfur doping of the ternary layer 7 may be set to a specific value.

Subsequent annealing in an inert or chalcogenide-containing atmosphere allows an independent setting and optimisation of the morphology, defect density, stoichiometry, and thus of the thermal characteristics, such as glass transition temperature, crystallization temperature, as well as further parameters such as layer strength, microstructure, etc. of the ternary layer 7 comprising two chalcogenide components $ASe_xS_y$ with the component A=Ge, Si, or other materials of the IV elements main group or transition metals (especially Zn, Cd, Hg).

While certain exemplary embodiments have been described in detail and shown in the accompanying drawings, it is to be understood that such embodiments are merely illustrative of and not restrictive to the scope of the invention. It will thus be recognized that various modifications may be made to the illustrated and other embodiments of the invention, without departing from the scope and spirit of the invention as defined by the appended claims.

What is claimed is:

1. A method for manufacturing an integrated circuit having an electrolyte material layer with a chalcogenide material incorporated or deposited therein, the method comprising:
   producing a semiconductor substrate;
   depositing a binary chalcogenide layer onto the semiconductor substrate;
   depositing a sulfur-containing layer onto the binary chalcogenide layer; and
   creating a ternary chalcogenide layer comprising two different chalcogenide compounds, wherein a component of the chalcogenide compounds comprises materials of one of the IV elements main group, a transition metal, and a combination thereof.

2. The method according to claim 1, wherein creating the ternary chalcogenide layer includes creation of two different chalcogenide compounds incorporated in the ternary chalcogenide layer, wherein the component of the chalcogenide compounds comprises materials of one of the IV elements main group, the group consisting of Zn, Cd, Hg, and a combination thereof.

3. The method according to claim 1, wherein depositing the binary chalcogenide layer comprises one or both of:
   sputtering a binary sputter target comprising GeSe; and
   reactive sputtering of the component in a selenium- or sulfur-containing atmosphere.

4. The method according to claim 1, wherein depositing the binary chalcogenide layer comprises one of thermal chemical vapor deposition, plasma-enhanced chemical vapor deposition, atomic layer deposition, physical vapor deposition, and evaporation.

5. The method according to claim 1, wherein depositing the binary chalcogenide layer comprises creating a binary selenium-containing A-Se layer or a sulfidic A-S layer, and wherein the component comprises materials of one of the IV elements main group, the group consisting of Zn, Cd, Hg, and a combination thereof.

6. The method according to claim 1, wherein depositing the sulfer-containing layer comprises depositing one of a sulfur layer, a sulfur-containing A-S layer, and a selenium-containing A-Se layer onto the binary chalcogenide layer, using a combined deposition and diffusion method.

7. The method according to claim 6, wherein depositing the sulfur-containing layer comprises a metal-organic chemical vapor deposition method, making use of carbonyl sulfide.

8. The method according to claim 7, wherein the sulfur of the carbonyl sulfide is substantially deposited onto the binary chalcogenide layer, forming the sulfur-containing layer, while a gaseous carbon monoxide is substantially escaping from the sulfur-containing layer and is disposed of by a vacuum pump of a vacuum system.

9. The method according to claim 6, wherein during creation of the ternary chalcogenide layer, one of the sulfur-containing A-Se layer and the selenium-containing A-Se layer is transformed into a ternary A-Se—S layer.

10. The method according to claim 6, wherein the sulfur-containing layer reacts in-situ with the existing binary chalcogenide layer, forming a coherent ternary $ASe_xS_y$ layer comprising a compound of Ge—Se—S and a compound of Si—Se—S.

11. The method according to claim 7, wherein the adsorption and reaction of the sulfur of the carbonyl sulfide on a surface of the binary chalcogenide layer is performed during the deposition of the sulfur-containing layer on the binary chalcogenide layer by means of the metal-organic chemical vapor deposition method.

12. The method according to claim 7, wherein a reaction of the sulfur of the carbonyl sulfide on a surface of the binary chalcogenide layer is performed after termination of the deposition of the sulfur-containing layer on the binary selenium-containing A-Se layer, during the deposition of the sulfur-containing layer, and afterwards.

13. The method according to claim 7, wherein a reactive gas species provides an addition of the component with an organic rest.

14. The method according to claim 7, wherein an inert carrier gas including $N_2$ and Ar is added to the carbonyl sulfide.

15. The method according to claim 7, wherein the carbonyl sulfide is supplied via a gas shower opening.

16. The method according to claim 1, wherein for the deposition of the sulfur-containing layer, a process temperature in the range of about 150° to 250° C. is used.

17. The method according to claim 1, wherein a process pressure in the range of 10 mTorr to 10 Torr is used.

18. The method according to claim 1, wherein a plasma is supplied to support the binary chalcogenide layer deposition.

19. The method according to claim 1, wherein microwaves are supplied to support the binary chalcogenide layer deposition.

20. The method according to claim 1, wherein the semiconductor substrate is made of Silicon and manufactured with structured layers.

21. The method according to claim 1, further comprising a furnace process or a RTP process in a suitable process atmosphere.

22. The method according to claim 1, wherein annealing in an inert or chalcogenide-containing atmosphere is employed for optimizing one or more of a stoichiometry, a morphology, a defect density, a doping, and a microstructure of the ternary layer.

23. The method according to claim 22, wherein the stoichiometry, the doping, and the morphology of the ternary chalcogenide layer are set by varying the duration of deposition and the substrate temperature during annealing.

24. The method according to claim 23, wherein the annealing is performed in an inert or chalcogenide-containing atmosphere to allow an independent setting and optimization of chemical, physical, and thermal characteristics of the ternary chalcogenide layer.

25. The method according to claim 1, wherein a process pressure of about 500 mTorr is used.

26. The method according to claim 1, wherein the integrated circuit is a resistive switching memory device.

* * * * *